United States Patent [19]

Thong

[11] Patent Number: 4,758,779

[45] Date of Patent: Jul. 19, 1988

[54] PROBE BODY FOR AN ELECTRICAL MEASUREMENT SYSTEM

[75] Inventor: Tran Thong, Beaverton, Oreg.

[73] Assignee: Tektronix, Inc., Beaverton, Oreg.

[21] Appl. No.: 848,548

[22] Filed: Apr. 7, 1986

[51] Int. Cl.[4] .............................................. G01R 31/02
[52] U.S. Cl. .................................. 324/72.5; 324/130; 324/158 P
[58] Field of Search ............... 324/72.5, 74, 130, 133, 324/158 P, 475; 73/1 R

[56] References Cited

U.S. PATENT DOCUMENTS

| | | | |
|---|---|---|---|
| 3,725,784 | 4/1973 | Bayer | 324/74 X |
| 4,042,881 | 8/1977 | Webb, Jr. | 324/72.5 X |
| 4,403,183 | 9/1983 | Leuker | 324/72.5 X |
| 4,450,411 | 5/1984 | Spurr | 324/74 X |
| 4,514,685 | 4/1985 | Gilker | 324/130 X |
| 4,633,173 | 12/1986 | Kashiwagi | 324/74 X |

OTHER PUBLICATIONS

The Engineering Staff of Analog Devices, Inc., Daniel H. Sheingold (Ed.), Analog-Digital Conversion Handbook, Jun. 1972, p. I-65.

*Primary Examiner*—Reinhard J. Eisenzopf
*Assistant Examiner*—Robert W. Mueller
*Attorney, Agent, or Firm*—Robert S. Hulse; John Smith-Hill

[57] ABSTRACT

A probe body for a measurement system comprises a probe-tip terminal for connection by way of a probe tip to a test point, a cable port for connection by way of at least one cable to a measurement instrument, probe circuitry, a function generator, and a switch. In a first state of the switch, the input terminal of the probe circuitry is connected to the probe-tip terminal and in a second state of the switch the input terminal of the probe circuitry is connected to the function generator. When the switch is in the second state, the function generator may be used to impress a signal having a predetermined waveform on the probe circuitry.

23 Claims, 1 Drawing Sheet

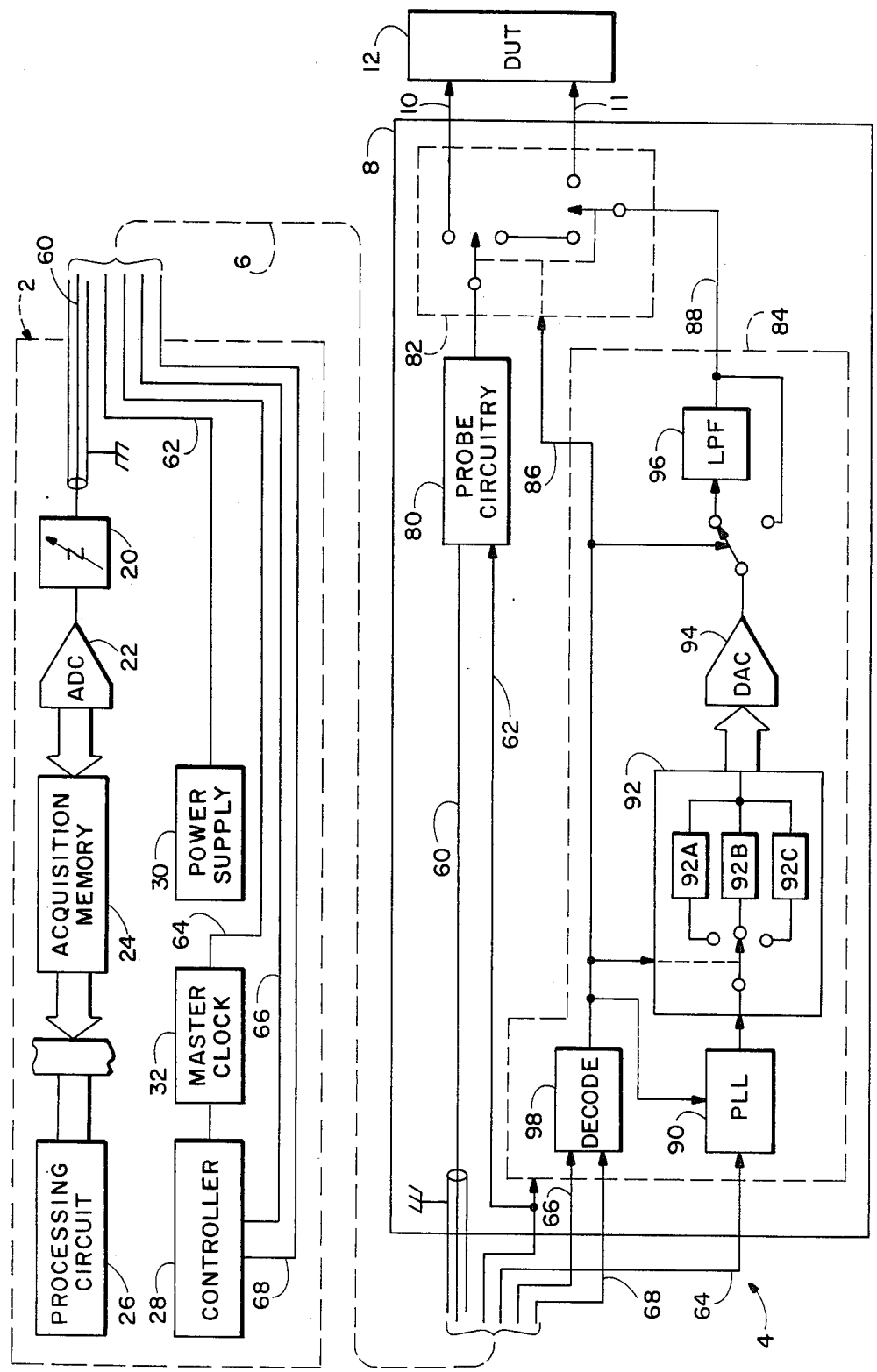

PROBE BODY FOR AN ELECTRICAL MEASUREMENT SYSTEM

This invention relates to a probe body for an electrical measurement system.

BACKGROUND OF THE INVENTION

An electrical measurement system generally comprises a measurement instrument, such as an oscilloscope or logic analyzer, and a probe assembly. The probe assembly comprises a probe body, a probe tip that extends from the probe body to contact a test point of a device under test, and a cable for connecting the probe body to the measurement instrument. The probe body may incorporate circuitry for interfacing the probe tip to the cable, for example impedance-matching circuitry, or other types of circuits, such as an attenuator. An active probe, such as the Tektronix P6202, incorporates active circuit elements in the probe body, and these require that the probe circuitry be connected to a power supply.

In order to enable a measurement instrument to provide accurate measurement results, it is necessary that the signal acquisition components of the system be calibrated. The signal acquisition components of an electrical measurement system include the probe assembly and the input circuits of the measurement instrument. In the case of a digital storage oscilloscope, these circuits include an analog-to-digital converter (ADC) for converting the analog electrical signal received from the probe assembly into digital form for storage in an acquisition memory. At present, calibration is accomplished by connecting the probe tip to a signal having a predetermined waveform and adjusting calibration circuits of the measurement instrument so that the measurement result actually provided by the measurement instrument is the same as the expected measurement result. Good measurement practice dictates that a measurement instrument be calibrated at short enough intervals to take account of changes in signal acquisition conditions, such as the temperature of the probe assembly. However, calibration is generally regarded as an inconvenient chore and therefore many users do not calibrate their instruments sufficiently frequently.

SUMMARY OF THE INVENTION

In accordance with one aspect of the present invention, a probe body comprises a probe-tip terminal for connection by way of a probe tip to a test point, a cable port for connection by way of a probe cable to a measurement instrument, probe circuitry, a function generator, and switch means. In a first state of the switch means, the probe-tip terminal is connected to the cable port by way of the probe circuitry, whereas in a second state of the switch means the function generator is connected to the probe circuitry in lieu of the probe-tip terminal. In the second state of the switch means, the function generator may be used to impress a signal having a predetermined waveform on the probe circuitry.

In accordance with another aspect of the present invention a measurement system comprises a measurement instrument, a probe body, and a probe cable for connecting a cable port of the probe body to the measurement instrument. The probe body comprises probe circuitry having an output terminal connected to the cable port and also having an input terminal, a function generator, and switch means. In a first state of the switch means, the input terminal of the probe circuitry is connected to a probe-tip terminal of the probe body, whereas in a second state of the switch means the input terminal of the probe circuitry is connected to the function generator. In the second state of the switch means, the function generator may be used to impress a signal having a predetermined waveform on the probe circuitry.

BRIEF DESCRIPTION OF THE DRAWING

For a better understanding of the invention, and to show how the same may be carried into effect, reference will now be made, by way of example, to the accompanying drawing, the single FIGURE of which is a block diagram illustrating an electrical measurement system embodying the present invention.

DETAILED DESCRIPTION

The illustrated measurement system comprises a measurement instrument 2, such as a digital storage oscilloscope, and a probe assembly 4. The probe assembly comprises a probe cable 6, a probe body 8 and a measurement probe tip 10. The probe tip 10 makes electrical contact with a test point of a device under test (DUT) 12. The probe body incorporates conventional probe circuitry 80 that interfaces the probe tip 10 to a signal conductor 60 of the probe cable. Electrical signals representing phenomena occurring in the device under test are conducted from the probe tip to the measurement instrument by way of the probe body 8 and the signal conductor 60.

As is conventional, the digital storage oscilloscope comprises an attenuator 20, an analog-to-digital converter (ADC) 22 and an acquisition memory 24. The signal that is received over the signal conductor of the cable 6 is attenuated by the attenuator 20 so as to bring its dynamic range within the dynamic range of the ADC 22, and the ADC converts the attenuated analog signal into digital form. The digital signal is written into the acquisition memory 24 for subsequent processing by processing circuitry 26 of the oscilloscope to yield measurement results. Operation of the attenuator 20, the ADC 22, the memory 24 and the processing circuitry 26 takes place under control of a controller 28. Electrical power for operation of the ADC 22, the memory 24, the processing circuitry 26 and the controller 28 is provided by a power supply 30. The power supply has a power supply terminal that is connected to the probe circuitry 80 by way of a power supply conductor 62 of the probe cable 6.

In addition to the probe circuitry 80, the probe body incorporates a switch device 82 and a function generator 84. The function generator has a data output 88 and a control output 86. The switch device 82 has two data input terminals, connected to the data output 88 of the function generator and the probe tip 10, and two data output terminals, connected to the probe circuitry 80 and a stimulus probe tip 11. The switch device has a first operating state in which it connects the probe tip 10 to the probe circuitry 80, a second operating state in which the probe tips 10 and 11 are disconnected and the data output 88 is connected to the probe circuitry 80, and a third operating state in which it connects a probe tip 10 to the probe circuitry 80 and the data output 88 to the stimulus probe tip 11. The signal provided at the control output 86 of the function generator is used to determine the operating state of the switch device 82.

The function generator includes a phase-locked loop 90, a memory device 92, a digital-to-analog converter (DAC) 94, a low-pass reconstruction filter 96 and a decoder 98. The memory device includes several separately selectable read-only memories (ROMs) 92A, 92B etc. The function generator is connected to the power supply conductor 62 of the probe cable and is also connected to a data clock conductor 64, a data transmit conductor 66 and a data conductor 68. When calibration of the measurement system is required, the function generator is enabled by placing a logical 1 on the data transmit conductor 66, and data is transmitted from the controller to the function generator over the data conductor 68 using a bit serial data stream. The decoder 98 generates control signals that place the switch 82 in its second operating state, enable the phase-locked loop 90 and select a particular ROM, e. g. the ROM 92A, of the memory device 92. The controller then enables a master clock generator 32 in the oscilloscope, and the clock generator 32 transmits clock pulses over the data clock conductor 64 to the phase-locked loop 90. The phase-locked loop includes a voltage-controlled oscillator (not shown) and when the PLL is enabled and receives the master clock the VCO oscillates and its oscillations become synchronized with the master clock. The PLL is designed to continue oscillating at the master clock rate for a short time after removal of the master clock. Therefore, when sufficient time to achieve synchronization has elapsed, the data clock conductor 64 is grounded and the phase-locked loop continues to oscillate, applying a slave clock to the selected ROM 92A. The digital data values stored in the ROM 92A are read out in a predetermined sequence and are applied to the DAC 94. The DAC 94 generates a corresponding sequence of analog voltage values. These analog voltage values may be applied directly to the output terminal 88 of the function generator, so that the waveform of the analog output signal is a square wave, a regular stairstep, or a random series of discrete levels, for example, or they may be applied to the terminal 88 through the low-pass filter and provide an analog output signal having, e. g., a sinusoidal waveform. The analog output signal of the function generator is applied to the probe circuitry 80 by way of the switch device 82. Thus, the function generator serves as a local source of a calibration signal, and enables the acquisition components of the measurement system to be calibrated without requiring the user to disconnect the probe tip from the device under test and connect it to a calibration signal generator. Use of the phase-locked loop 90 incorporated in the function generator makes it possible to ground the conductor 64 after synchronization has been achieved and therefore the possibility of cross-talk between the signal transmitted over the signal conductor and the master clock is avoided.

The waveform of the signal that is provided at the the output of the ADC 22 in response to the calibration signal provided by the function generator is compared with the expected waveform, and the result of the comparison is used to calibrate the acquisition components of the measurement system. For example, the calibration could be carried out by processing the digital signal provided by the ADC prior to writing it into the acquisition memory, or by processing the signal stored in the acquisition memory before carrying out subsequent processing for obtaining a measurement result.

The illustrated measurement system may also be used for applying stimuli to the device under test. In order to apply a stimulus, the data that is sent to the function generator while the function generator is enabled has the effect of placing the switch device 82 in its third operating state. The analog output signal of the function generator is applied to the DUT 12 by way of the stimulus probe 11, and the signal acquired at the test point by the probe 10 is passed to the oscilloscope by way of the probe circuitry 80 and the cable 6 without being contaminated by the master clock.

It will be appreciated that the present invention is not restricted to the particular probe body that has been described and illustrated, and that variations may be made therein without departing from the scope of the invention. For example, the particular nature of the function generator is unimportant, so long as it is capable of generating a signal having a predetermined waveform for impressing on the probe circuitry. If it is sufficient that the signal provided at the terminal 88 of the function generator have a rectangular waveform, the output of the memory device 92 may be applied directly to the terminal 88. If separate cables are used for the signal conductor 60 and the conductors 64, 66 and 68, the master clock may be used to clock the memory device 92 and the phaselocked loop 90 would not be necessary. Also, the signals generated by the function generator may be varied through use of programmable memory devices, such as electrically-eraseable PROMs, which can be loaded over the data conductor 68. Conductors carrying high speed signals, such as the conductors 60 and 64, generally need to be shielded in order to avoid signal degradation. In order to minimize the quantity of shielded conductor, the conductor 60 may be used to transmit the master clock to the function generator if an additional switch, controlled by the decoder 98, is interposed between the probe circuitry 80 and the conductor 60 for connecting the conductor 60 selectively to the probe circuitry (for acquisition) and the function generator (for calibration or stimulation). Of course, in this case it is not possible to acquire a signal while the master clock is being applied to the function generator, and therefore it is essential that the function generator include a slave clock generator having at least short term stability.

I claim:

1. A probe body having a first probe-tip terminal for connection by way of a probe tip to a test point, a second probe-tip terminal for connection to a stimulus probe, and a cable port for connection by way of at least one cable to a measurement instrument, and comprising:
   probe circuitry having an output terminal connected to the cable port and also having an input terminal,
   a function generator, and
   switch means having a first state in which the input terminal of the probe circuitry is connected to the first probe-tip terminal, a second state in which the input terminal of the probe circuitry is connected to the function generator, so that when the switch means are in the second state the function generator may be used to impress a signal having a predetermined waveform on the probe circuitry, and a third state in which the input terminal of the probe circuitry is connected to the first probe-tip terminal and the function generator is connected to the second probe-tip terminal.

2. A probe body according to claim 1, wherein the function generator includes a read-only memory and a clock generator for clocking the contents out of the read-only memory.

3. A probe body according to claim 2, wherein the clock generator is a phase-locked loop operative to oscillate in synchronism with an externally-applied master clock and to continue oscillation after removal of the master clock.

4. A measurement system comprising a measurement instrument, a probe body having a first probe-tip terminal for connection by way of a probe tip to a test point, a second probe-tip terminal for connection to a stimulus probe, and a cable port, and a probe cable for connecting the cable port of the probe body to the measurement instrument, the probe body comprising:

probe circuitry having an output terminal connected to the cable port and also having an input terminal, a function generator, and switch means having a first state in which the input terminal of the probe circuitry is connected to the first probe-tip terminal, a second state in which the input terminal of the probe circuitry is connected to the function generator, so that when the switch means are in the second state the function generator may be used to impress a signal having a predetermined waveform on the probe circuitry, and a third state in which the input terminal of the probe circuitry is connected to the first probe-tip terminal and the function generator is connected to the second probe-tip terminal.

5. A measurement system according to claim 4, wherein the measurement instrument includes a master clock generator that can be connected to the function generator of the probe body over the probe cable, and wherein the function generator comprises a local clock generator for receiving the master clock generated by the master clock generator and generating a local clock that is synchronized with the master clock, and a read-only memory connected to receive the local clock and generate a predetermined sequence of digital data values.

6. A measurement system according to claim 5, wherein the probe body further comprises a digital-to-analog converter connected to receive the predetermined sequence of digital data values generated by the read-only memory.

7. A measurement system according to claim 5, wherein the local clock generator comprises a phase-locked loop.

8. A measurement system according to claim 5, wherein the measurement instrument includes means for applying the master clock to the local clock generator in intermittent fashion, and the local clock generator comprises a phaselocked loop which oscillates in synchronism with the master clock when the master clock is applied to the local clock generator and continues oscillation after the master clock ceases to be applied to the local clock generator.

9. A measurement system according to claim 5, wherein the function generator includes a read-only memory and a clock generator for clocking the contents out of the read-only memory.

10. A measurement system according to claim 9, wherein the clock generator is a phase-locked loop operative to oscillate in synchronism with an externally-applied master clock and to continue oscillation after removal of the master clock.

11. A probe body having a probe-tip terminal for connection by way of a probe tip to a test point, and a cable port for connection by way of at least one cable to a measurement instrument, and comprising:

probe circuitry having an output terminal connected to the cable port and also having an input terminal, a function generator which comprises a non-volatile memory and a local clock generator for clocking the contents out of the non-volatile memory, the local clock generator being operative to operate in synchronism with an externally-applied master clock and to continue operation after removal of the master clock, and switch means having a first state in which the input terminal of the probe circuitry is connected to the probe-tip terminal and a second state in which the input terminal of the probe circuitry is connected to the function generator, so that when the switch means are in the second state the function generator may be used to impress a signal having a predetermined waveform on the probe circuitry.

12. A probe body according to claim 11, wherein the local clock generator is a phase-locked loop.

13. A probe body according to claim 11, wherein the non-volatile memory is a read-only memory.

14. A measurement system comprising a measurement instrument including a master clock generator, and also comprising a probe body having a probe-tip terminal for connection by way of a probe tip to a test point and also having a cable port, and a probe cable for connecting the cable port of the probe body to the measurement instrument, the probe body comprising:

probe circuitry having an output terminal connected to the cable port and also having an input terminal, a function generator which comprises a local clock generator for receiving over the probe cable the master clcok generated by the master clock generator and generating a local clock that is synchronized with the master clock, and a non-volatile memory connected to receive the local clock and generate a predetermined sequence of digital data values, and switch means having a first state in which the input terminal of the probe circuitry is connected to the probe-tip terminal and a second state in which the input terminal of the probe circuitry is connected to the function generator, so that when the switch means are in the second state the function generator may be used to impress a signal having a predetermined waveform on the probe circuitry.

15. A measurement system according to claim 14, wherein the probe body further comprises a digital-to-analog converter connected to receive the predetermined sequence of digital data values generated by the non-volatile memory.

16. A measurement system according to claim 14, wherein the local clock generator is a phase-locked loop.

17. A probe body according to claim 14, wherein the non-volatile memory is a read-only memory.

18. A measurement system according to claim 14, which the probe body has a second probe-tip terminal for connection to a stimulus probe, and the switch means have a third state in which the input terminal of the probe circuitry is connected to the first-mentioned probe-tip terminal and the function generator is connected to the second probe-tip terminal.

19. A measurement system according to claim 14, wherein the measurement instrument includes means for applying the master clock to the local clock generator in intermittent fashion, and the local clock generator comprises a phase-locked loop which oscillates in synchronism with the master clock when the master clock is applied to the local clock generator and continues oscillation after the master clock ceases to be applied to the local clock generator.

20. A measurement system comprising a measurement instrument, a probe body having a probe-tip terminal for connection by way of a probe-tip to a test point and also having a cable port, and a probe cable for connecting the cable port of the probe body to the measurement instrument, a probe body comprising:

probe circuitry having an output terminal connected to the cable port and also having an input terminal, a function generator which comprises a non-volatle memory and a local clock generator for clocking the contents out of the non-volatile memory, the local clock generator being operative to oscillate in synchronism with an externally-applied master clock and to continue oscillation after removal of the master clock, and switch means having a first state in which the input terminal of the probe circuitry is connected to the probe terminal and a second state in which the input terminal of the probe circuitry is connected to the function generator, so that when the switch means are in the second state the function generator may be used to impress a signal having a predetermined waveform on the probe circuitry.

21. A measurement system according to claim 20, wherein the local clock generator is a phase-locked loop.

22. A probe body according to claim 20, wherein the non-volatile memory is a read-only memory.

23. A measurement system according to claim 20, which the probe body has a second probe-tip terminal for connection to a stimulus probe, and the switch means have a third state in which the input terminal of the probe circuitry is connected to the first-mentioned probe-tip terminal and the function generator is connected to the second probe-tip terminal.

* * * * *